United States Patent
Bouthinon et al.

(10) Patent No.: US 11,811,151 B2
(45) Date of Patent: Nov. 7, 2023

(54) SYSTEM OF AT LEAST TWO TRANSMITTING AND/OR RECEIVING UNITS CONNECTED TO A COMMON ANTENNA

(71) Applicants: Continental Automotive France, Toulouse (FR); Continental Automotive GmbH, Hannover (DE)

(72) Inventors: Jean-Christophe Bouthinon, Cugnaux (FR); Dawid Durka, Toulouse (FR); Frederic Lathiere, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 489 days.

(21) Appl. No.: 16/761,547

(22) PCT Filed: Nov. 15, 2018

(86) PCT No.: PCT/FR2018/052850
§ 371 (c)(1),
(2) Date: May 5, 2020

(87) PCT Pub. No.: WO2019/097168
PCT Pub. Date: May 23, 2019

(65) Prior Publication Data
US 2021/0175605 A1 Jun. 10, 2021

(30) Foreign Application Priority Data
Nov. 17, 2017 (FR) ...................................... 1760845

(51) Int. Cl.
*H01Q 5/50* (2015.01)
*B60C 23/04* (2006.01)
(Continued)

(52) U.S. Cl.
CPC ........... *H01Q 5/50* (2015.01); *B60C 23/0452* (2013.01); *H01Q 5/328* (2015.01); *H01Q 5/35* (2015.01);
(Continued)

(58) Field of Classification Search
CPC ........ H01Q 5/314; H01Q 5/328; H01Q 5/335; H01Q 5/35; H01Q 5/50
See application file for complete search history.

(56) References Cited

U.S. PATENT DOCUMENTS

| 2,594,055 A | 4/1952 | Miller |
| 5,880,649 A | 3/1999 | Tai et al. |

(Continued)

FOREIGN PATENT DOCUMENTS

| CN | 1980073 A | 6/2007 |
| CN | 102694262 A | 9/2012 |

(Continued)

OTHER PUBLICATIONS

International Search Report and Written Opinion for International Application No. PCT/FR2018/052850, with partial English translation, dated Feb. 12, 2019, 10 pages.
(Continued)

*Primary Examiner* — Ab Salam Alkassim, Jr.
(74) *Attorney, Agent, or Firm* — RatnerPrestia

(57) ABSTRACT

A system of at least two units that transmit and/or receive a signal at a first or a second frequency, respectively, each of the units being individually connected to the antenna, which is common to a first branch and to a second branch, respectively. The first branch or the antenna includes first passive electronics preventing passage of the signal at the second frequency to the first unit and allowing passage of the signal at the first frequency to the antenna. The second branch or the antenna includes second passive electronics
(Continued)

preventing passage of the signal at the first frequency to the second unit and allowing passage of the signal at the second frequency to the antenna.

11 Claims, 5 Drawing Sheets

(51) Int. Cl.
    *H01Q 5/35*     (2015.01)
    *H01Q 7/00*     (2006.01)
    *H01Q 5/328*     (2015.01)
    *H03H 7/01*     (2006.01)
    *H01Q 1/22*     (2006.01)

(52) U.S. Cl.
    CPC .............. *H01Q 7/00* (2013.01); *H03H 7/175* (2013.01); *H03H 7/1758* (2013.01); *H03H 7/1766* (2013.01); *H01Q 1/2241* (2013.01); *H03H 2007/013* (2013.01)

(56) References Cited

U.S. PATENT DOCUMENTS

| | | | |
|---|---|---|---|
| 6,378,360 B1 | 4/2002 | Bartels | |
| 9,065,165 B2* | 6/2015 | Wong | H01Q 7/00 |
| 11,095,033 B2* | 8/2021 | Li | H01Q 5/335 |
| 11,652,293 B2* | 5/2023 | Samardzija | H01Q 7/005 |
| | | | 713/300 |
| 2006/0199549 A1* | 9/2006 | Lee | H01Q 9/145 |
| | | | 455/82 |
| 2007/0135083 A1* | 6/2007 | Kim | H01Q 1/242 |
| | | | 455/344 |
| 2007/0146221 A1* | 6/2007 | Oshiyama | H01Q 9/16 |
| | | | 343/895 |
| 2007/0241985 A1* | 10/2007 | Suzuki | H01Q 1/50 |
| | | | 343/859 |
| 2008/0158064 A1 | 7/2008 | Ponce De Leon et al. | |
| 2008/0204163 A1 | 8/2008 | Royak et al. | |
| 2008/0231526 A1* | 9/2008 | Sato | H01Q 7/00 |
| | | | 343/722 |
| 2009/0193903 A1 | 8/2009 | Cobianu et al. | |
| 2010/0279734 A1* | 11/2010 | Karkinen | H01Q 5/35 |
| | | | 455/554.2 |
| 2011/0187478 A1* | 8/2011 | Link | H03H 9/547 |
| | | | 333/133 |
| 2012/0242552 A1 | 9/2012 | Nishi et al. | |
| 2013/0102357 A1* | 4/2013 | Vance | H01Q 1/50 |
| | | | 343/857 |
| 2013/0207855 A1 | 8/2013 | Chien et al. | |
| 2013/0214979 A1 | 8/2013 | McMilin et al. | |
| 2013/0258911 A1 | 10/2013 | Choksi | |
| 2013/0278467 A1 | 10/2013 | Dassano et al. | |
| 2013/0307740 A1* | 11/2013 | Pajona | H01Q 5/307 |
| | | | 343/866 |
| 2013/0307742 A1* | 11/2013 | Hu | H01Q 9/265 |
| | | | 343/852 |
| 2014/0152522 A1* | 6/2014 | Karkinen | H01Q 5/35 |
| | | | 343/803 |
| 2014/0197993 A1* | 7/2014 | Li | H04B 1/0458 |
| | | | 343/700 MS |
| 2014/0203890 A1* | 7/2014 | Taniguchi | H03H 7/1791 |
| | | | 333/175 |
| 2014/0210607 A1* | 7/2014 | Patterson | H01Q 1/2241 |
| | | | 340/447 |
| 2014/0292602 A1 | 10/2014 | Suzuki et al. | |
| 2015/0002348 A1* | 1/2015 | Wong | H01Q 9/42 |
| | | | 343/724 |
| 2015/0109175 A1 | 4/2015 | Kim et al. | |
| 2016/0176247 A1 | 6/2016 | Cheikh et al. | |
| 2017/0133999 A1* | 5/2017 | Ishizuka | H03H 9/64 |
| 2017/0149139 A1* | 5/2017 | Wong | H01Q 1/243 |
| 2017/0279185 A1 | 9/2017 | Hung et al. | |
| 2018/0083759 A1* | 3/2018 | Onaka | H04L 5/0098 |
| 2018/0145707 A1* | 5/2018 | Cheon | H04B 1/0475 |
| 2018/0159220 A1* | 6/2018 | Kuroda | H01Q 9/42 |
| 2018/0174015 A1 | 6/2018 | Destraves | |
| 2019/0131722 A1* | 5/2019 | Ryu | H01Q 25/005 |
| 2019/0190481 A1* | 6/2019 | Mori | H05K 1/0298 |
| 2019/0245516 A1* | 8/2019 | Taguchi | H03H 9/6463 |
| 2020/0194890 A1* | 6/2020 | Hung | H01Q 1/243 |
| 2020/0381828 A1* | 12/2020 | Li | H01Q 5/335 |
| 2020/0395906 A1* | 12/2020 | Parkes, Jr. | H03M 1/183 |
| 2021/0119336 A1* | 4/2021 | Sun | H01Q 5/35 |

FOREIGN PATENT DOCUMENTS

| | | | |
|---|---|---|---|
| CN | 203277656 U | 11/2013 | |
| CN | 105474460 A | 4/2016 | |
| CN | 206412480 | 8/2017 | |
| DE | 69734846 T2 | 8/2006 | |
| DE | 102005046452 A1 | 3/2007 | |
| FR | 2788644 A1 | 7/2000 | |
| GB | 2361584 A | 10/2001 | |
| JP | 2009107530 A | 5/2009 | |
| JP | 2014138366 A | 7/2014 | |
| JP | 2017022518 A | 1/2017 | |
| TW | 201334290 A | 8/2013 | |
| WO | 09745277 A1 | 3/1999 | |
| WO | 2007011295 A1 | 1/2007 | |
| WO | 2013076894 A1 | 5/2013 | |
| WO | 2016193457 A1 | 12/2016 | |
| WO | 2017022370 A1 | 2/2017 | |
| WO | WO-2017173582 A1 * | 10/2017 | ............. H01Q 1/243 |

OTHER PUBLICATIONS

International Search Report and Written Opinion for International Application No. PCT/FR2018/052850, dated Feb. 12, 2019, 14 pages (French).

Chinese Office Action for Application No. 201880074176.8, dated Aug. 26, 2021 with translation, 13 pages.

\* cited by examiner

SYSTEM OF AT LEAST TWO TRANSMITTING AND/OR RECEIVING UNITS CONNECTED TO A COMMON ANTENNA

CROSS REFERENCE TO RELATED APPLICATIONS

This application is the U.S. National Phase application of PCT International Application No. PCT/FR2018/052850, filed Nov. 15, 2018, which claims priority to French Patent Application No. 1760845, filed Nov. 17, 2017, the contents of such applications being incorporated by reference herein.

FIELD OF THE INVENTION

The present invention relates to a system of at least two transmitting and/or receiving units connected to a common antenna. A first unit transmits and/or receives a signal at a first frequency and at least a second unit transmits and/or receives a signal at a second frequency. Each of the units is individually connected to the common antenna by a first branch and a second branch respectively for the passage of the signal.

The invention is particularly applicable to a transmission and/or reception device having at least two frequencies. Such a transmitting and/or receiving device may form part of a fob for gaining "hands-free" access to a motor vehicle or of a tire pressure sensor in a wheel unit fitted to a wheel of a motor vehicle.

BACKGROUND OF THE INVENTION

Such a transmission and/or reception device integrated into an access fob communicates by radiofrequency waves with an electronic unit on board a motor vehicle, in order to unlock the doors or the trunk of the vehicle or perform another function such as starting the vehicle without the user having to manually operate the vehicle doors.

Such a transmitting and/or receiving device may be integrated in a wheel unit comprising a tire pressure sensor of a wheel of a motor vehicle, and fastened either to the rim of the wheel of the vehicle, or to the tread of a vehicle tire. The pressure sensor communicates by radiofrequency waves with a central electronic unit on board the vehicle in order to send, to the central electronic unit, pressure measurements that are, if necessary, coupled with measurements of other parameters, such as temperature, that are carried out by the sensor in the tire, and thus warn the user of a possible underinflation of the tire. Such a transmission and/or reception device transmits a radiofrequency signal and/or receives in return a radiofrequency signal.

It is known to use a system of at least two connected transmitter and/or receiver units. Two solutions are proposed in the prior art. The first is to use a common antenna of complex geometry suitable for each frequency and the second solution is to have two antennas optimized respectively for each frequency.

When a single antenna is used for two transmit and/or receive frequencies, it is necessary to find a compromise in terms of antenna efficiency in order mainly to minimize the return loss for each frequency. This means that the efficiency of the antenna for each frequency is not optimal.

An active switch is also used in each branch connecting the antenna to a transmitting and/or receiving unit. This requires a control unit for each switch, which increases the cost of the system. Furthermore, the switches may be sources of failure.

When two antennas are used, the reception and/or the emission of each frequency is better, but cost is increased and the system made more bulky, which is unacceptable if it is to be used in a wheel unit or in an access fob, the available space being very limited in both cases.

SUMMARY OF THE INVENTION

The problem underlying the present invention is, for a system with at least two units for transmitting and/or receiving respective signals having two different frequencies, to provide a single signal transmitting and/or receiving antenna which is capable of receiving or transmitting signals optimally without the use of an active switch between each unit and the associated antenna.

To this end, an aspect of the present invention relates to a system of at least two transmitting and/or receiving units connected to a common antenna, a first unit that transmits and/or receives a signal at a first frequency and at least one second unit that transmits and/or receives a signal at a second frequency, each of said at least two units being individually connected to the common antenna for the passage of the radiofrequency signal by a first branch or a second branch, respectively, this system being noteworthy in that the first branch or the antenna comprises first passive electronic means preventing passage of the signal at the second frequency to the first unit while the first passive electronic means allow passage of the signal at the first frequency to the antenna, and in that the second branch or the antenna comprises second passive electronic means preventing passage of the signal at the first frequency to the second unit while the second passive electronic means allow passage of the signal at the second frequency to the antenna.

By passive electronic means, what is meant is electronic means that do not perform an active circuit-opening or -closing action but that have an electronic structure that selectively prevents the passage of the signal for the frequency not associated with the unit while these passive electronic means allow the pulsed voltage signal to pass for the frequency associated with the unit. It follows that the connection between a unit and the antenna is not completely cut, as it would be by an active switch, but is only for a signal with a predefined frequency that corresponds to the frequency of the voltage signal from the other unit.

The technical effect is that the antenna is supplied with a signal at the frequency desired among the first and second frequencies. Passive electronic means do not need to be controlled by a control unit like switches would, simplifying control and allowing miniaturization of the system. Passive electronic means are different from the mechanical or active means of conventional switches and are more efficient. The closure or opening of a branch for a signal of a given frequency occurs automatically with respect to the frequency of the signal.

Advantageously, at least the first passive electronic means or the second passive electronic means comprise at least one so-called trap circuit that is connected to the first or the second unit and that is formed of an inductor and a capacitor in parallel, the trap circuit being closed for all frequencies except a resonant frequency of the trap circuit, an inductance of the inductor and a capacitance of the capacitor of the trap circuit being selected so that the trap circuit connected to the first unit resonates at the second frequency and the trap circuit connected to the second unit resonates at the first frequency.

In this first embodiment, the resonant properties of a trap circuit are used to open the associated branch at the resonant frequency, which is chosen to be the frequency of the signal to be stopped. It is then possible to select a trap circuit that has a resonance at the frequency to be barred from a branch, so that the trap circuit acts as a passive electronic switch for this branch.

Advantageously, an inductor having a parasitic capacitance in parallel, and a resonant frequency being previously assigned to the inductor, the trap circuit associated with the first unit or with the second unit is formed of at least one inductor by itself forming a trap circuit, said inductor being selected to have a preset resonant frequency corresponding to the second frequency when said at least one inductor by itself forming a trap circuit forms the trap circuit associated with the first unit or to the first frequency when said at least one inductor by itself forming a trap circuit forms the trap circuit associated with the second unit, respectively.

This embodiment exploits the fact that an inductor behaves as though it had a parasitic capacitor in parallel and therefore in isolation acts as a trap circuit. By "in isolation" what is meant is that the inductor is not associated with a capacitor. In contrast, there may be several inductors in series resonating at different frequencies, in the case of a system with more than two transmitting and/or receiving units. Using the resonant properties of an inductor for which the resonant frequency is known and given by its manufacturer simplifies a trap circuit while keeping the same advantages.

Advantageously, at least the first passive electronic means or the second passive electronic means comprise, in the respective first branch or second branch or in the antenna, at least one series circuit formed of an inductor and a capacitor in series, the series circuit being open for all frequencies except a resonant frequency of the series circuit, an inductance of the inductor and a capacitance of the capacitor being selected so that the series circuit resonates at the second frequency towards the first branch or the first unit and at the first frequency towards the second branch or the second unit.

In this second embodiment, the resonant properties of a series circuit containing an inductor and capacitor in series are used to close the associated branch for the resonant frequency, which is chosen to be the frequency of the radiofrequency signal to be passed. It is then possible to select a series circuit having a resonance at the frequency to be driven into a branch so that the circuit acts as a passive electronic switch for this branch.

Advantageously, the series circuit formed of an inductor and a capacitor in series is mounted at one end of a stub from the first branch or second branch or the antenna, and is connected to ground at its other end.

Advantageously, the first passive electronic means take the form of a circuit blocking a specific frequency, said circuit being formed of an inductor and a capacitor in parallel or of a lone inductor, and the second passive electronic means comprise at least one series circuit formed of an inductor and a capacitor in series connected to ground.

It is thus possible to use a trap circuit or an inductor that by itself forms a trap circuit in one of the branches while the other branch comprises a series circuit connected to ground. It would also be possible to associate a trap circuit or an inductor that by itself forms a trap circuit with a series circuit connected to ground in the same branch, the isolation of the transmitting and/or receiving units of the circuit being guaranteed in the system by the presence of at least one of the trap circuits.

Advantageously, the antenna is a loop antenna connected at each of its ends to the first branch or the second branch, respectively, the trap circuits, associated with the series passive circuits, nonetheless being implemented. This embodiment does not limit the present invention, another form of antenna may also come within the scope of an aspect of the present invention. In contrast, this form of loop antenna is preferred since it may be supplied at each of its two ends by a respective transmitting and/or receiving unit at the first or at the second frequency.

Advantageously, the loop antenna has a stub branch internal to the antenna connecting it to ground, the internal stub branch comprising passive electronic stub means that open the stub branch for the signal at the lowest frequency of the first and second frequencies and that close the stub branch for the voltage signal at the highest frequency of the first and second frequencies.

If the antenna length is considered to have been optimized for the lowest frequency, for the highest frequency it is not necessary and even disadvantageous to use the entire antenna length. Shortening the antenna for the highest frequency allows antenna efficiency to be improved and the signal at the highest frequency to be better transmitted or received.

Advantageously, the internal stub branch is connected to the loop antenna at a distance, which is measured from one of the ends of the loop antenna, which is connected to the highest of the first and second frequencies, the distance being dependent on the highest frequency. The higher the frequency, the more it is possible to decrease the used length of the antenna. The antenna length is thus dependent on frequency, this improving antenna efficiency and therefore transmission.

Advantageously, the passive electronic stub means take the form of a series circuit of the respective internal stub branch, said circuit being formed of an inductor and a capacitor in series, the series circuit of the internal stub branch being open for all frequencies except a resonant frequency of the series circuit corresponding to the highest frequency of the first and second frequencies.

This makes it possible to use only a portion of the loop antenna for the highest frequency while the lowest frequency passes through the entire loop antenna. The transmission and/or reception of signals are/is improved.

Advantageously, the system comprises at least a third unit that transmits and/or receives a radiofrequency signal at a third frequency, said unit being connected to the antenna by a third branch, the third branch comprising third passive electronic means that open the third branch for a signal at the first frequency and at the second frequency while the third passive electronic means close the third branch for a signal at the third frequency.

There may then be, in the same branch, several passive electronic means that open the branch for a respective frequency. This may, for example, be achieved with two single inductors, which are said to be "in isolation" since they are not associated with a respective capacitor, and which are resonant at a respective frequency corresponding to the frequencies of the system that are not emitted or received by the unit associated with the branch housing the passive electronic means in question.

Advantageously, the antenna is a loop antenna, the third branch being a stub branch connected between the two ends of the loop antenna at a distance, measured from one of the ends of the loop antenna, depending on the third frequency (with a predetermined margin of error).

For one loop antenna, there may be one stub branch connected to ground and another stub branch connected to a third unit. There may be more than two stub branches for one loop antenna in the case of a system comprising more than three transmitting and/or receiving units.

The stub branch connected to the third unit may be at least partially merged with the branch connected to the ground, so as to end up stubbed out of the branch connected to the ground, provided that passive electronic means are also provided in the end part stubbed out of the branch connected to ground. This works when the third frequency is close to the highest frequency or corresponds to the portion of the loop antenna not traveled by the signal at the highest frequency, the length of the antenna being distributed between the signal at the highest frequency and the third frequency.

An aspect of the invention also relates to a wheel unit for a motor-vehicle wheel or a fob for gaining hands-free access to a motor vehicle, characterized in that it comprises such a system.

BRIEF DESCRIPTION OF THE DRAWINGS

Other features, aspects and advantages of the present invention will become apparent on reading the following detailed description and on examining the appended drawings given by way of non-limiting examples, and in which.

DETAILED DESCRIPTION OF THE PREFERRED EMBODIMENTS

In the figures, the antenna associated with the two transmitting and/or receiving units is a loop antenna. This is non-limiting and the antenna may take another form.

Below, reference is made to all the figures taken in combination, though the figures most relevant to the features being described will be mentioned.

Figure 1A:
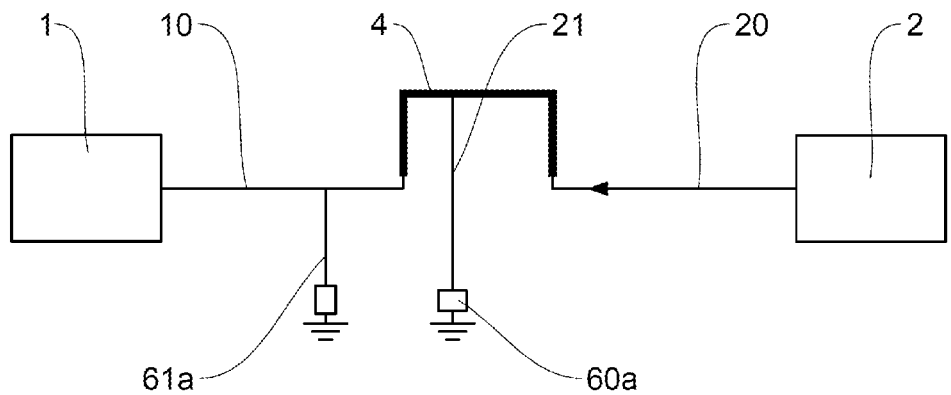
FIGS. 1A and 1B are schematic representations of a system of two transmitting and/or receiving units connected to a common antenna, a first transmitting and/or receiving unit transmitting and/or receiving a radiofrequency signal at a first frequency and a second transmitting and/or receiving unit transmitting and/or receiving a radiofrequency signal at a second frequency according to an aspect of the present invention, the signal at the lowest frequency reaching the antenna in FIG. 1A and the signal at the highest frequency reaching the antenna in FIG. 1B by traversing only part of the antenna.
Figure 1B:
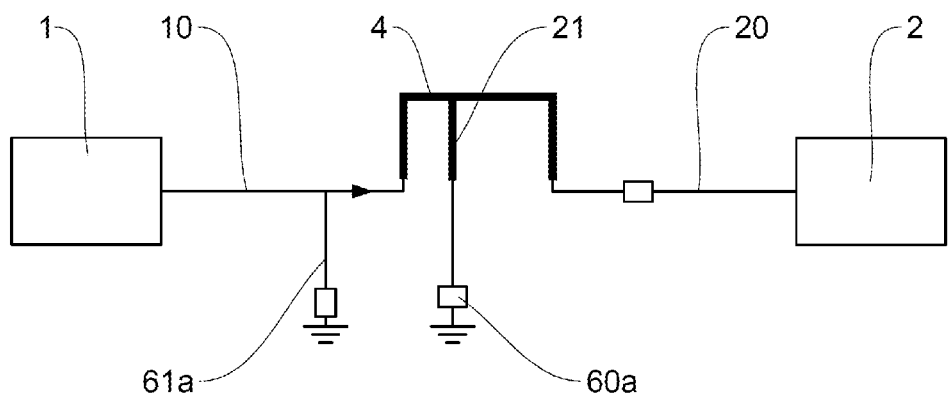
Figure 2:
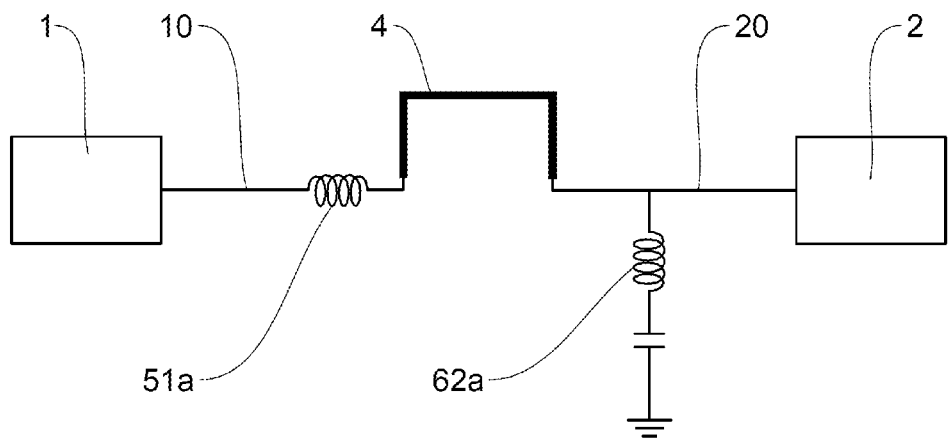
FIG. 2 is a schematic representation of a system of two transmitting and/or receiving units connected to a common antenna according to an embodiment of the present invention, the first passive electronic means taking the form of an inductor by itself forming a trap circuit that opens the first branch for a signal at the second frequency and that closes the same branch for the first frequency and the second passive electronic means taking the form of a series circuit connected to ground, which closes the second branch at the first frequency and opens the second branch for a signal at the second frequency, the antenna formed at the first frequency thus being of the loop short-circuited to ground type, the antenna formed at the second frequency being of the monopole type because it is open at its end.

With particular reference to FIGS. 1A, 1B, 2 and 7, an aspect of the present invention relates to a system of at least two transmitting and/or receiving units 1, 2 connected to a common antenna 4. In FIGS. 1A, 1B and 2, two transmitting and/or receiving units 1, 2 are shown and in FIG. 7, three transmitting and/or receiving units 1, 2, 3 are shown.

A first unit 1 transmits and/or receives a signal at a first frequency and at least a second unit 2 transmits and/or receives a signal at a second frequency. To pass the respective signal, each of said at least two units 1, 2 is individually connected to the common antenna 4, the first unit 1 being connected by a first branch 10 and the second unit being connected by a second branch 20, respectively.

The first branch 10 or the antenna 4 comprises first passive electronic means 51*a*, 61*a* (which are therefore not controlled mechanical switches) preventing passage of the signal at the second frequency to the first unit 1 while the first passive electronic means 51*a*, 61*a* allow passage of the voltage signal pulsed at the first frequency to the antenna 4.

The passive electronic means of a branch or of the antenna 4 are therefore configured not to let pass one or more signals with a frequency associated with another transmitting and/or receiving unit of the system.

Likewise, the second branch 20 or the antenna 4 comprises second passive electronic means 60*a*, 62*a* preventing passage of the voltage signal pulsed at the first frequency to the second unit 2 while the second passive electronic means 60*a*, 62*a* allow passage of the voltage signal pulsed at the second frequency to the antenna 4.

It follows that the passive electronic means may be in a branch or incorporated into the antenna 4. For example, in FIG. 1A, first passive electronic means 61*a* are incorporated into the first branch 10 to prevent passage of the voltage signal pulsed at the second frequency to the first unit 1 while second passive electronic means 60*a* preventing passage of the voltage signal pulsed at the first frequency to the second unit 2 are incorporated into the antenna 4.

Figure 7:
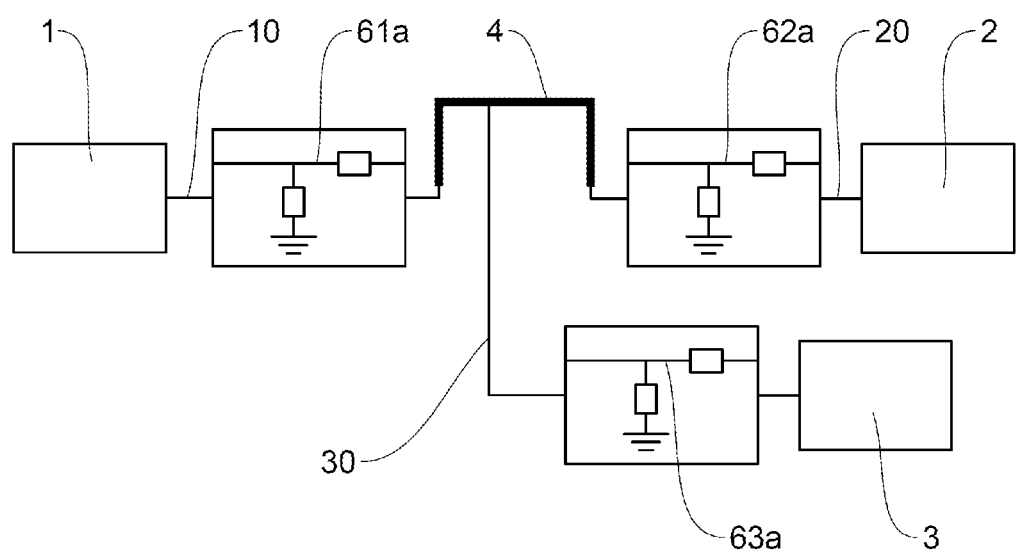
FIG. 7 is a schematic representation of a system comprising three transmitting and/or receiving units connected to a common antenna according to one embodiment of the present invention, the third unit being connected at a point on a length of the antenna.
Figure 8:
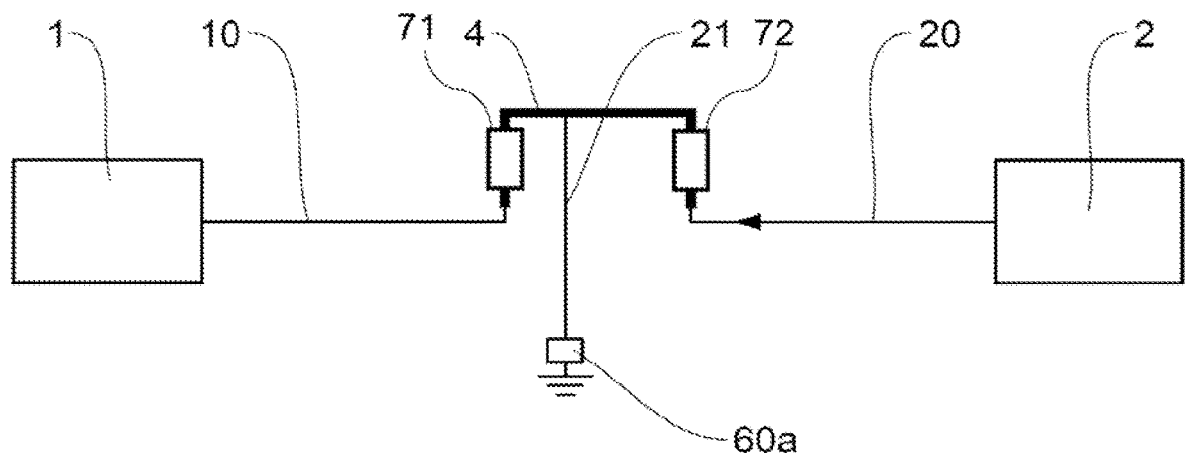
FIG. 8 is a schematic representation of another system of two transmitting and/or receiving units connected to a common antenna.

In FIG. 2, passive electronic means 51*a*, 62*a* are incorporated into the first branch 10 and into the second branch 20, respectively. In FIG. 7, which shows a system comprising three transmitting and/or receiving units, with a third unit 3 connected to the antenna 4 by a third branch 30, first passive electronic means 61a are incorporated into the first branch 10 to prevent passage of the voltage signals pulsed at the second frequency from the second unit 2 and at a third frequency from the third unit 3 to the first unit 1. In FIG. 8, first and second passive electronic means 71, 72 are incorporated into the antenna 4.

Likewise, second passive electronic means 62a are incorporated into the second branch 20 to prevent passage of voltage signals pulsed at the first frequency from the first unit 1 and at the third frequency from the third unit 3 to the second unit 2. Finally, third passive electronic means 63a are incorporated into the third branch 30 to prevent passage of voltage signals pulsed at the first frequency from the first unit 1 and at the second frequency from the second unit 2 to the third unit 3.

In the following description of the trap circuits and of the series circuits, reference will only be made to the first unit 1 and to the second unit 2. However, what is stated remains valid for a third unit 3 and even for a higher number of units.

A trap circuit made up of an inductor that by itself forms a trap circuit 51a is shown in FIG. 2 in the first branch 10 associated with the first transmitting and/or receiving unit 1, and a serial circuit connected to ground 62a is shown stubbed out from the second branch 20 associated with the second transmitting and/or receiving unit 2.

Figure 4A:
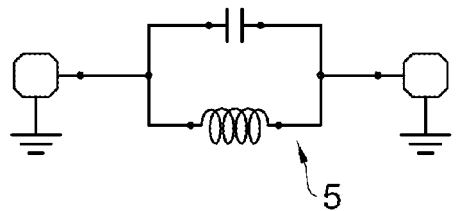
FIGS. 4A and 4B show a trap circuit with a capacitor mounted so as to bypass an inductor and a curve of the loss in the trap circuit, the maximum loss being at the resonance of the trap circuit, respectively, FIGS. 5A and 5B graphically show the attenuation of transmission or reception level at the resonant frequencies of coil inductors used as trap circuits by themselves and the resonant frequency of each coil as a function of the inductance of the coil, respectively, FIGS. 6A-6C respectively show a series circuit with a capacitor connected in series with an inductor, the series circuit being mounted stubbed out of the first or second branch and connected to ground in FIG. 6B, FIG. 6C showing a curve of the loss in the series circuit, the maximum loss between the two ports being due to an optimal short-circuit to ground at the resonance of the series circuit.

In a first optional embodiment, at least the first passive electronic means 51a, 61a or the second passive electronic means 60a, 62a may take the form of at least one so-called trap circuit, referenced 5 in FIG. 4A, which is associated with the first unit 1 or second unit 2, and which is formed of an inductor and a capacitor in parallel. The trap circuit is closed for all frequencies except a resonant frequency of the trap circuit.

An inductance of the inductor and a capacitance of the capacitor of the trap circuit are then preselected so that the trap circuit associated with the first unit 1 resonates at the second frequency and so that the trap circuit associated with the second unit 2 resonates at the first frequency.

Figure 4B:
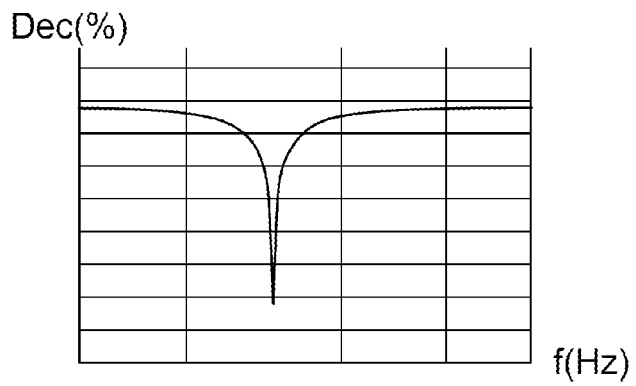

An example of a trap circuit 5 is shown in FIG. 4A. FIG. 4B shows a curve of the losses between the ports of the trap circuit 5 as a function of frequency. Energy and therefore the signal circulates between the ports of the trap circuit 5 for all frequencies, except the resonant frequency. At the resonant frequency, the losses are substantial and the energy no longer circulates, hence the name trap circuit 5.

As any inductor has a parasitic capacitance in parallel with the inductor, and as it is possible to determine and assign a resonant frequency to an inductor during its manufacture, the trap circuit associated with the first unit 1 or with the second unit 2 or an additional unit 3 may be formed of at least one inductor that by itself forms a trap circuit 51a, this being shown in FIG. 2.

This inductor is selected to have a previously assigned resonant frequency corresponding respectively to the second frequency, when said at least one inductor by itself forms the trap circuit 51a associated with the first unit 1, or to the first frequency, when said at least one inductor by itself forms the trap circuit associated with the second unit 2.

There may be several inductors forming a trap circuit 5 for a respective frequency when there are more than two transmitting and/or receiving units 1, 2. For example, for a three-unit system, there may be, in the first branch 10 or the antenna 4, an inductor forming a trap circuit 5 associated with the first unit 1, this circuit trapping the second frequency associated with the second unit 2, and an additional inductor also forming a trap circuit 5 associated with the first unit 1, this circuit trapping the third frequency associated with the third unit 3, and so on for additional transmitting and/or receiving units.

Figure 5A:
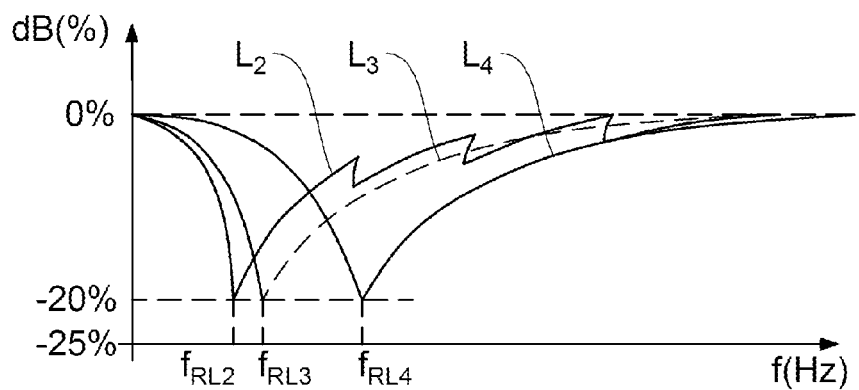

FIG. 5A shows a decrease in amplitude in decibels dB (%) as a function of frequency f(Hz) in hertz for three inductors L2, L3 and L4 having different resonant frequencies fRL2, fRL3 and fRL4. Inductors integrated into a branch associated with a transmitting and/or receiving unit to form by themselves a respective trap circuit may be chosen so that their own resonant frequency fRL2, fRL3, fRL4 is substantially equal to one or more of the frequencies associated with the other transmitting and/or receiving units of the system.

Figure 5B:
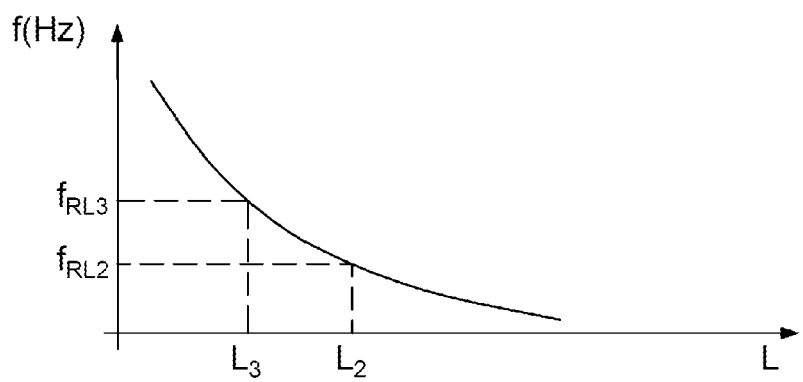

FIG. 5B illustrates the curve of the resonant frequency f(Hz) of the inductors L2, L3 as a function of their inductance. If these inductors L2 and L3 are intended to form by themselves a respective trap circuit associated with a transmitting and/or receiving unit, their respective inductances may be chosen in such a way that the resonant frequency fRL2 or fRL3 of the inductor L2 or L3 corresponds to one of the frequencies, coming from other transmitting and/or receiving units, to be blocked from said transmitting and/or receiving unit.

With particular reference to FIGS. 1A, 1B, 2, 6a and 6b, in a second optional embodiment, at least the first passive electronic means 61a or the second passive electronic means 60a, 62a may take the form, in the respective first or second branch 10, 20 or in the antenna 4, of at least one series circuit 6, 6a formed by an inductor and a capacitor in series.

Such a series circuit 6, 6a is open for all frequencies except for a resonant frequency of the series circuit 6, 6a. An inductance of the inductor and a capacitance of the capacitor are selected so that the series circuit 6, 6a resonates at the second frequency towards the first branch 10 or the first unit 1 and at the first frequency towards the second branch 20 or the second unit 2.

Again for a number of transmitting and/or receiving units greater than two, a signal at a frequency associated with a transmitting and/or receiving unit may be blocked by a series circuit 6, 6a from another transmitting and/or receiving unit.

Figure 6A:
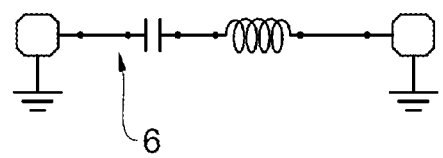

A series circuit 6 that may be used as passive electronic means is shown in FIG. 6A. The series circuit 6, which is formed of an inductor and a capacitor in series, may be connected at one end as a stub to the first branch, the second branch 20 or the xth branch or, alternatively, to the antenna 4.

Figure 6B:
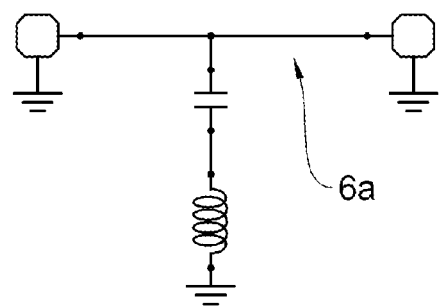

It is possible to connect this circuit in series to ground at its other end. Such a stubbed-out, ground-connected series circuit 6a is shown in FIG. 6B. In FIGS. 6A and 6B, the capacitance of the capacitor may be 10 picofarads and the inductance of the inductor 10 nanohenry, this in no way being limiting, the capacitance of the capacitor and the inductance of the inductor being selected so that in-circuit the circuit resonates at the frequency of the signal to be blocked.

Figure 6C:
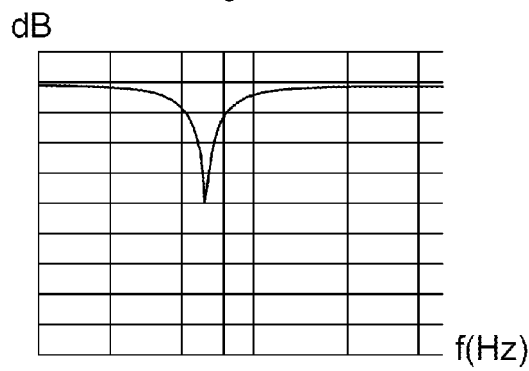

FIG. 6C shows the loss in decibels of the signal at the resonant frequency of the series circuit 6 shown in FIG. 6B. Since the series resonance causes passage of the signal to ground, it is no longer transmitted between the two ports.

In the case of the series circuit 6 shown in FIG. 6A, at the series resonant frequency the losses of the circuit are minimum and the circuit closes. The losses are substantial for all the other frequencies, and hence the circuit may be said to be open.

As shown in an example in FIG. 2, the first passive electronic means 51a may take the form of a trap circuit formed of an inductor and a capacitor in parallel or of a single inductor, the latter case being illustrated in FIG. 2. The second passive electronic means 62*a* may take the form of at least one series circuit formed of an inductor and a capacitor in series, the series circuit being in FIG. 2 stubbed out of the second branch 20 and connected to ground.

The reverse is also possible and similar arrangements may be envisaged for a system with more than two transmitting and/or receiving units 1, 2. The first passive electronic means 51*a* may be associated with the first transmitting and/or receiving unit 1, which may transmit/receive at the highest but also at the lowest frequency of the two transmitting and/or receiving units 1, 2, and vice versa for the second passive electronic means 62*a*.

Figure 3:
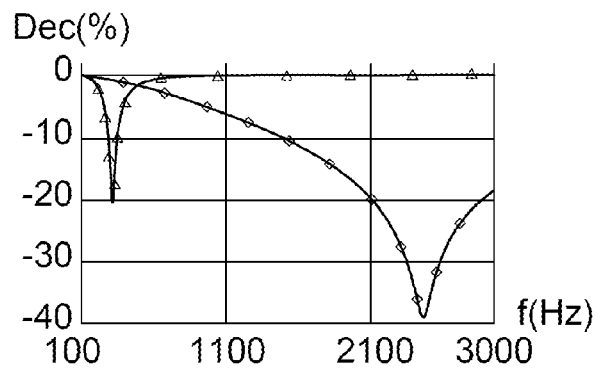
FIG. 3 shows two curves of the loss in the first and second branches of the system shown in FIG. 2, the losses being highest at the resonance of the first and second passive electronic means.

FIG. 3 shows the percentage losses Dec (%) in the first and second branches 10, 20 of the system illustrated in FIG. 2, respectively, as a function of the frequency f(Hz) in millihertz.

The curve with the triangles shows the loss in the second branch 20 caused by the series circuit employed as the second passive electronic means 62*a*, for a signal of low frequency coming from the first unit 1, and the curve with the diamonds shows the loss in the first branch 10 caused by the lone inductor employed as a trap circuit 5 that plays the role of the first passive electronic means 51*a*, 61*a*, for a signal of high frequency coming from the second unit 2. The low frequency is in FIG. 3 about 300 MHz and the high frequency about 2400 MHz, this being non-limiting.

In all the figures showing the system, the antenna 4 may be a loop antenna 4 connected at each of its ends to the first branch 10 or the second branch 20 respectively, this being preferred but non-limiting.

As shown more particularly in FIGS. 1A and 1B, it is possible for the loop antenna 4 to have a stub branch 21 internal to the antenna 4 connecting it to ground. The internal stub branch 21 may thus comprise passive electronic stub means 60*a* that open the stub branch 21 for the signal at the lowest frequency of the first and second frequencies and that close the stub branch 21 for the signal at the highest frequency of the first and second frequencies.

As shown in FIGS. 1A, 1B, considering the second unit 2 to be the transmitting and/or receiving unit associated with the lowest frequency, this being non-limiting, the passive electronic stub means 60*a* are equivalent to the second passive means that block the passage of the signal at the highest frequency from the second transmitting and/or transmitting unit 2 associated with the lowest frequency.

The stub branch 21 internal to the antenna 4 may be connected to the loop antenna 4 at a distance measured from one of the ends of the loop antenna 4, which is connected to the highest of the first and second frequencies, the distance being dependent on the highest frequency. Thus for a signal at the highest frequency, only one portion of the loop antenna 4 is used.

The passive electronic stub means 60*a* may take the form of a series circuit of the respective internal stub branch 21, said circuit being formed of an inductor and a capacitor in series, the series circuit of the internal stub branch 21 being open for all frequencies except a resonant frequency of the series circuit corresponding to the highest frequency of the first and second frequencies. For the signal at the highest frequency, the series circuit of the internal stub branch 21 is closed.

Alternatively, the passive electronic stub means 60*a* may take, in the respective internal stub branch 21, the form of a trap circuit formed of an inductor and a capacitor mounted in parallel with the inductor, the trap circuit of the internal stub branch 21 being closed for all frequencies (and in particular at the highest frequency) except for a resonant frequency of the trap circuit corresponding to the lowest frequency of the first and second frequencies, for which frequency the circuit is open.

As shown in FIG. 7, the system may comprise at least a third unit 3 that transmits and/or receives a voltage signal pulsed at a third frequency, which is connected to the antenna 4 by a third branch 30. The third branch 30 may comprise third passive electronic means 63*a* that open the third branch 30 for a voltage signal pulsed at the first frequency and at the second frequency, while the third passive electronic means 63*a* close the third branch 30 for a voltage signal pulsed at the third frequency, so as to allow it to be sent to the antenna 4.

In a particularly advantageous preferred embodiment of the present invention, which embodiment is shown in FIG. 7, the antenna 4 may be a loop antenna 4. The third branch 30 may be a stub branch 21 connected between the two ends of the loop antenna 4 at a distance measured from one of the ends of the loop antenna 4 that is dependent on the third frequency (with a predetermined margin of error).

With particular reference to FIGS. 1A, 1B and 7, the third branch 30 may be at least partially common to the stub branch 21 of the loop antenna 4 for the passage of the signal at the highest frequency. In this case, the stub branch 21 of the loop antenna 4 for the passage of the signal at the highest frequency extends from the third branch 30 to be connected by an end stub branch to ground, and comprises passive electronic means that prevent passage of signals at a frequency other than the highest frequency, i.e. signals from the second and third transmitting and/or receiving units 2, 3, when the first transmitting and/or receiving unit 1 is the unit associated with the highest frequency.

Considering the case where a first transmitting and/or receiving unit 1 is the unit associated with the highest frequency and where a third transmitting and/or receiving unit 3 associated with a frequency intermediate between the highest frequency and the lowest frequency is that of the second transmitting and/or receiving unit 2, the signal of the third unit 3 may pass through the portion of the antenna 4 complementary to the portion serving for the passage of the signal of highest frequency coming from the first unit 1.

A particularly advantageous but nonlimiting application of the system according to an aspect of the invention, i.e. the system described above, is to a motor-vehicle tire wheel unit or to a fob for gaining hands-free access to a motor vehicle, the bulk of such a wheel unit or of such an access fob needing necessarily to be small, and this meaning the implementation of a system according to an aspect of the invention may be required.

The invention claimed is:

1. A system comprising at least two transmitting and/or receiving units connected to an antenna, the at least two transmitting and/or receiving units including a first unit that transmits and/or receives a voltage signal pulsed at a first frequency and at least one second unit that transmits and/or receives a signal at a second frequency, each of said at least two units being respectively connected to the antenna for the passage of the signal via respective first and second branches, the first branch or the antenna comprising first passive electronics preventing passage of the signal at the second frequency to the first unit while the first passive electronics allow passage of the signal at the first frequency to the antenna and the second branch or the antenna comprising second passive electronics preventing passage of the signal at the first frequency to the second unit while the second passive electronics allow passage of the signal at the second frequency to the antenna, wherein each of said at least two units are individually connected to the antenna respectively by the first branch or the second branch connected to a respective end of the antenna wherein the antenna is a loop antenna connected at each of its ends to the first branch or the second branch, respectively, and wherein the loop antenna has a stub branch internal to the antenna connecting it to a ground, the internal stub branch comprising a passive electronic stub that opens the stub branch for the signal at the lowest frequency of the first and second frequencies and that closes the stub branch for the signal pulsed at the highest frequency of the first and second frequencies, wherein the internal stub branch is connected to the loop antenna at a distance, which is measured from one of the ends of the loop antenna, which is connected to the highest of the first and second frequencies, the distance being inversely proportional to the highest frequency such that the distance decreases as the highest frequency increases.

2. The system as claimed in claim 1, wherein at least the first passive electronics or the second passive electronics comprise at least one trap circuit that is associated with the first unit or the second unit and that is formed of an inductor and a capacitor in parallel, the trap circuit being closed for all frequencies except a resonant frequency of the trap circuit, an inductance of the inductor and a capacitance of the capacitor of the trap circuit being selected so that when the trap circuit is associated with the first unit, the trap circuit resonates at the second frequency and when the trap circuit is associated with the second unit, the trap circuit resonates at the first frequency.

3. The system as claimed in claim 1, wherein at least the first passive electronics or the second passive electronics comprise at least one trap circuit that is associated with the first unit or with the second unit and that is formed of at least one inductor by itself forming the trap circuit, said inductor being selected to have a preset resonant frequency corresponding to the second frequency when said at least one inductor by itself forms the trap circuit associated with the first unit or to the first frequency when said at least one inductor by itself forms the trap circuit associated with the second unit, respectively.

4. The system as claimed in claim 1, wherein at least the first passive electronics or the second passive electronics comprise, in the respective first branch or the second branch or in the antenna, at least one series circuit formed of an inductor and a capacitor in series, the series circuit being open for all frequencies except a resonant frequency of the series circuit, an inductance of the inductor and a capacitance of the capacitor being selected so that the series circuit resonates at the second frequency towards the first branch or the first unit and at the first frequency towards the second branch or the second unit.

5. The system as claimed in claim 4, wherein the series circuit formed of the inductor and the capacitor in series is mounted at one end of a stub from the first branch or second branch or the antenna and is connected to ground at its other end.

6. The system as claimed in claim 1, wherein the first passive electronics take the form of a circuit blocking a specific frequency, said circuit being formed of an inductor and a capacitor in parallel or of an inductor by itself forming a trap circuit, and the second passive electronics comprise at least one series circuit formed of an inductor and a capacitor in series connected to ground.

7. The system as claimed in claim 1, wherein the passive electronic stub takes the form of a series circuit of the respective internal stub branch, said series circuit being formed of an inductor and a capacitor in series, the series circuit of the internal stub branch being open for all frequencies except a resonant frequency of the series circuit corresponding to the highest frequency of the first and second frequencies.

8. The system as claimed in claim 1, further comprising at least a third unit that transmits and/or receives a voltage signal pulsed at a third frequency, said unit being connected to the antenna by the stub branch.

9. A wheel unit for a motor-vehicle wheel or a fob for gaining hands-free access to a motor vehicle, comprising a system as claimed in claim 1.

10. The system as claimed in claim 4, wherein the first passive electronics take the form of a circuit blocking a specific frequency, said circuit being formed of an inductor and a capacitor in parallel or of an inductor by itself forming a trap circuit, and the second passive electronics comprise at least one series circuit formed of an inductor and a capacitor in series connected to ground.

11. The system as claimed in claim 5, wherein the first passive electronics take the form of a circuit blocking a specific frequency, said circuit being formed of an inductor and a capacitor in parallel or of an inductor by itself forming a trap circuit, and the second passive electronics comprise at least one series circuit formed of an inductor and a capacitor in series connected to ground.

\* \* \* \* \*